US011871670B2

(12) United States Patent
Komkommer (10) Patent No.: US 11,871,670 B2
(45) Date of Patent: Jan. 9, 2024

(54) GENERATOR

(71) Applicant: HELIOS NOVA B.V., Vrouwenpolder (NL)

(72) Inventor: Daniel Komkommer, Wissenkerke (NL)

(73) Assignee: HELIOS NOVA B.V., Vrouwenpolder (NL)

( * ) Notice: Subject to any disclaimer, the term of this patent is extended or adjusted under 35 U.S.C. 154(b) by 559 days.

(21) Appl. No.: 16/771,296

(22) PCT Filed: Dec. 12, 2018

(86) PCT No.: PCT/NL2018/050836
§ 371 (c)(1),
(2) Date: Jun. 10, 2020

(87) PCT Pub. No.: WO2019/117719
PCT Pub. Date: Jun. 20, 2019

(65) Prior Publication Data
US 2020/0395525 A1 Dec. 17, 2020

(30) Foreign Application Priority Data
Dec. 12, 2017 (NL) ...................................... 2020065

(51) Int. Cl.
*H10N 15/20* (2023.01)
*H10N 10/13* (2023.01)

(52) U.S. Cl.
CPC ............. *H10N 15/20* (2023.02); *H10N 10/13* (2023.02)

(58) Field of Classification Search
CPC ......... H01L 37/04; H01L 35/30; H01L 35/32; H10N 10/13; H10N 15/20
See application file for complete search history.

(56) References Cited

U.S. PATENT DOCUMENTS 4,730,137 A 3/1988 Vollers
5,476,137 A * 12/1995 Ochiai ................. B23Q 11/143
165/47

(Continued)

FOREIGN PATENT DOCUMENTS

DE 4133559 A1 * 6/1993 ............. H02N 10/00
EP 1326292 A1 7/2003
(Continued)

OTHER PUBLICATIONS

English machine translation of RO 127786A2. (Year: 2012).*
(Continued)

*Primary Examiner* — Andrew J Golden
(74) *Attorney, Agent, or Firm* — KDW Firm PLLC (57) ABSTRACT

A generator configured to generate electrical energy from heat, for example from sunlight. The generator includes: a moveable carrier connected to a kinetic-electric converter; and a stationary support. One of the carrier and the support is provided with a magnet and the other is provided with separate ferromagnetic elements. A heat supply is associated with the one of the carrier and the support that is provided with the magnet to direct heat onto successively at least one of the ferromagnetic elements to warm the ferromagnetic element to above a Curie temperature thereof, to thereby impart reciprocal movement of the carrier relative to the support through magnetic interaction between the magnet and the ferromagnetic elements. A cooling system such as a thermo-electric generator or a heat sink is configured for cooling at least one of the magnet and the ferromagnetic elements.

15 Claims, 6 Drawing Sheets

(56) References Cited

U.S. PATENT DOCUMENTS

| | | | |
|---|---|---|---|
| 2004/0027774 A1 | 2/2004 | Takizawa et al. | |
| 2010/0253181 A1 | 10/2010 | Hazelwood | |
| 2010/0313926 A1 | 12/2010 | Sun et al. | |
| 2013/0263599 A1* | 10/2013 | Kuo | H02N 10/00 60/682 |

FOREIGN PATENT DOCUMENTS

| | | | | |
|---|---|---|---|---|
| EP | 1843458 A1 | 10/2007 | | |
| GB | 1409343 A | 10/1975 | | |
| RO | 127786 A2 * | 8/2012 | | |
| WO | 2014141864 A1 | 9/2014 | | |
| WO | WO-2014141864 A1 * | 9/2014 | | H02N 10/00 |

OTHER PUBLICATIONS

English machine translation of WO2014/141864. (Year: 2014).*
DE-4133559-A1 English machine translation (Year: 1993).*
International Search Report and Written Opinion for the International Patent Application No. PCT/NL2018/050836, dated Mar. 29, 2019, 13 pages.

* cited by examiner

GENERATOR

This is a national stage application filed under 35 U.S.C. § 371 of pending international application PCT/NL2018/050836, filed Dec. 12, 2018, which claims priority to Netherlands Patent Application No. NL 2020065, filed Dec. 12, 2017, the entirety of which applications are hereby incorporated by reference herein.

The present invention relates to a thermodynamic device based on a magnetic field and Curie effect for heat/energy conversion. A dynamo or other type of generator can be coupled to such a device for the purpose of generating electrical energy from an excited movement, or dynamic energy (movement) produced thereby can be directly utilized as mechanical energy, for instance as drive for an installation coupled thereto.

Known from US 2010/0253181 A1 is a device of the type having a number of the features of claim 1, such as: a frame; a carrier coupled rotatably to the frame; at least two elements with magnetic properties which are associated with the carrier and move in a path during rotation of the carrier; a magnet which is oriented to the path; and a heating which is disposed close to the path and at a distance from the magnet along the path in order to selectively heat elements in an orientation close to the magnet.

The known device has a number of drawbacks. The carrier is susceptible to the heating and can thus display an unacceptable saturation and begin to heat elements. When the elements are heated by the carrier and not only by the heating, there is a danger of the elements being unable to cool sufficiently after being heated by the heating, this rendering the entire operation of the device ineffective. The disclosure of US 2010/0253181 does not give any cause to change the configuration known therefrom in any way, or to even consider doing so. This known technique is based on a fixed main magnet and magnetic rings or magnetic discs in the form of thin plaques as the elements which are mounted on a disc as carrier and reach their Curie temperature through heat, after which they cool once again in order to be reheated. The alleged operation can however not be realized because heating a magnet irrevocably results in the loss of its magnetic properties.

Known from U.S. Pat. No. 4,730,137 is a configuration wherein at least one element with magnetic properties is arranged on a rim-like rotor of a wheel-like carrier rotatable about a shaft. There is here also the danger of the rim-like rotor, against which the at least one element with magnetic properties is wholly arranged, being heated to such an extent after a period of time in use that it contributes—in addition to the heating—toward heating of the elements, and the alleged operation of this known device is thus rendered ineffective.

GB 2240433 and WO 94/15393 both relate to a single ring as element with magnetic properties on and round a substantially round disc as carrier.

JP 1129785 relates to a configuration based on a completely different principle, wherein elements are arranged on a carrier which is supposedly belt-like and trained around reversing wheels, and the belt-like carrier is intended to rotate around the reversing wheels. Below in the embodiment description reference is made to a ring shaped carrier but the present disclosure could also involve an endless belt carrier.

The present invention has for its object to provide an improved device compared to the known configuration, to which end the generator is configured to generate electrical energy from heat, for example from sunlight, comprising:

a moveable carrier, which is reciprocally moveable along a movement path and connected to a kinetic-electric converter;

a stationary support arranged at the movement path;

wherein one of the carrier and the support is provided with a magnet arranged along or in the movement path and the other of the carrier and the support is provided with separate ferromagnetic elements arranged along or in the movement path; and a heat supply associated with the one of the carrier and the support that is provided with the magnet, wherein the heat supply is configured to direct heat onto successively at least one of the ferromagnetic elements to warm the ferromagnetic element to above a Curie temperature thereof, to thereby impart reciprocal movement of the carrier relative to the support through magnetic interaction between the magnet and the ferromagnetic elements.

Such a generator is for instance known from WO-2014/141864, wherein numbers of revolutions per minute are low, and consequently also the power generated is low.

In order to improve on this known system, according to the present disclosure is provided: a cooling system configured for cooling at least one of the magnet and the ferromagnetic elements.

The present disclosure provides benefits in terms of efficiency, amount of generated energy and cooling of ferromagnetic elements, all simultaneously.

The cooling system may comprise a thermo-electric generator arranged along or in at least a part of the movement path. From EP 1 326 292 cooling of magnets in a thermo-electric converters is known. Consequently, it is inventive to deploy a such thermo-electric converter as part of a cooling system for the device of the present disclosure.

In a particular preferred embodiment the generator may additionally or alternatively comprise a heat sink arranged along or in at least a part of the movement path. The heat sink may be associated with the thermo-electric generator. In this manner, heat may be extracted from the device using either or both of the thermo-electric converter and the heat sink, and when both are used, in a preferred embodiment, the heat sink may cool the thermo-electric converter and the ferromagnetic elements, where the converter is heated with heat cooled from the ferromagnetic elements (lamellae) of the device. Heat gathered by the heat sink may be stored in a storage, for example a fluid tank, and when the thermo-electric converter is omitted, the heat sink may be coupled with such a storage to discharge heat cooled directly from the device. Then, the generator may exhibit the feature that the heat sink is arranged opposite the heat supply, relative to the thermo-electric generator. Further, then, the thermo-electric generator is arranged on the heat sink, between the heat sink and the heat supply.

In a particular preferred embodiment the generator may additionally or alternatively comprise a cooling system to cool the ferromagnetic element warmed to above a Curie temperature thereof. The generator may then exhibit the feature that the cooling system is configured to act on the warmed ferromagnetic element at a distance along the movement path relative to the heat supply. In an embodiment with a cooling system, wherein the cooling system may be based on at least one of a group of: air, coolant, water, gel, cooling fins, refrigeration.

In a particular preferred embodiment the generator may additionally or alternatively exhibit the feature that the thermo-electric generator is arranged opposite the heat supply, relative to the ferromagnetic elements. Then, the ferromagnetic elements may be arranged on the thermo-electric generator, between the thermo-electric generator and the heat supply.

In a particular preferred embodiment the generator may additionally or alternatively exhibit the feature that the ferromagnetic elements are arranged on the support, and the heat supply and magnet are arranged on the carrier.

In a particular preferred embodiment the generator may additionally or alternatively exhibit the feature that the heat supply is configured to warm the at least one of the ferromagnetic elements to be warmed for the warmed one of the ferromagnetic elements to alter magnetic attractability thereof, whereby the magnet attracts or repels the warmed one of the ferromagnetic elements or attracts another of the ferromagnetic elements neighboring the warmed one of the ferromagnetic element.

Following the above indication of the concept of the present disclosure in terms and expressions of the appended claims, below an embodiment description is provided of at least one embodiment in the appended drawing, to which the present disclosure is not limited and is provided merely for information to the skilled reader, to clearly set out the nature of the concept of the present disclosure, and wherein:

Figure 1:
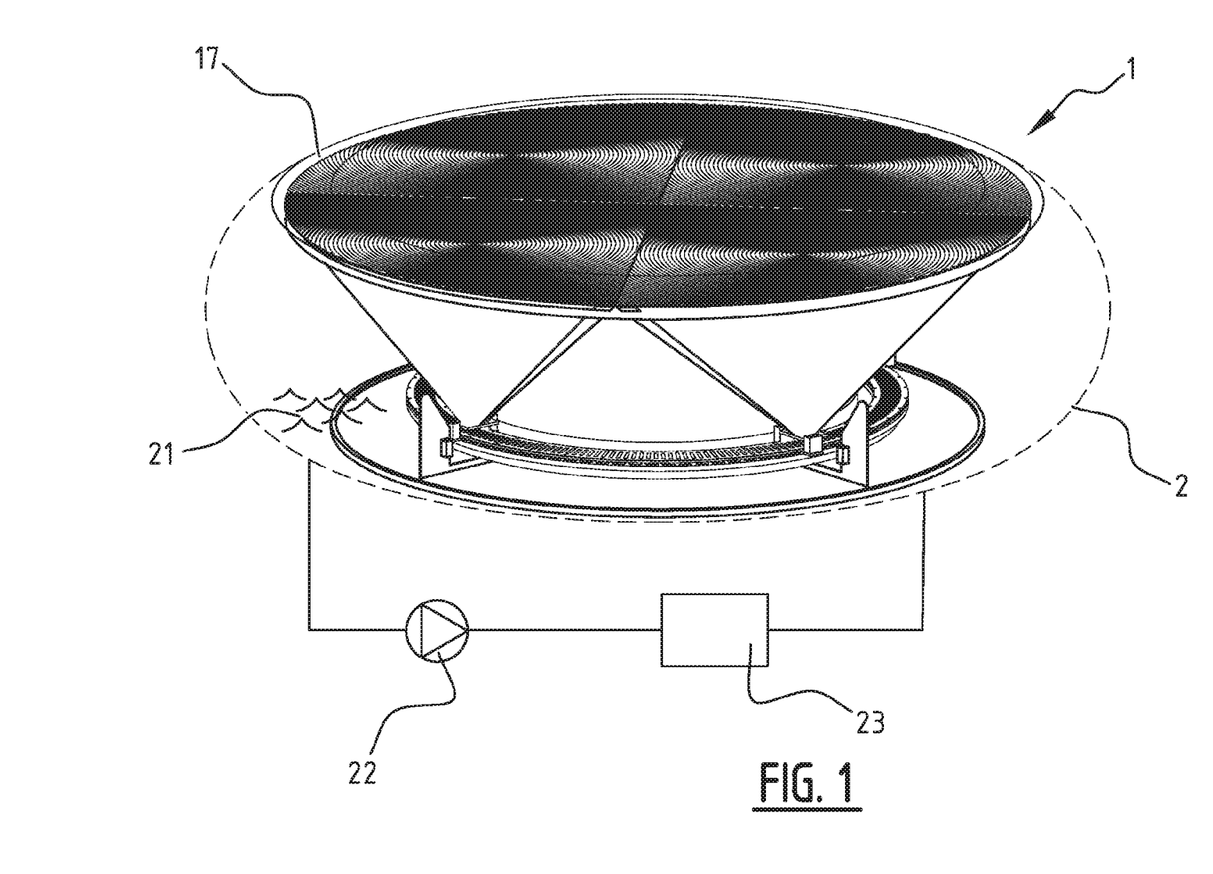
FIGS. 1 and 6 show an impression of an embodiment of an generator according to the present disclosure in complementary perspective views.
Figure 2:
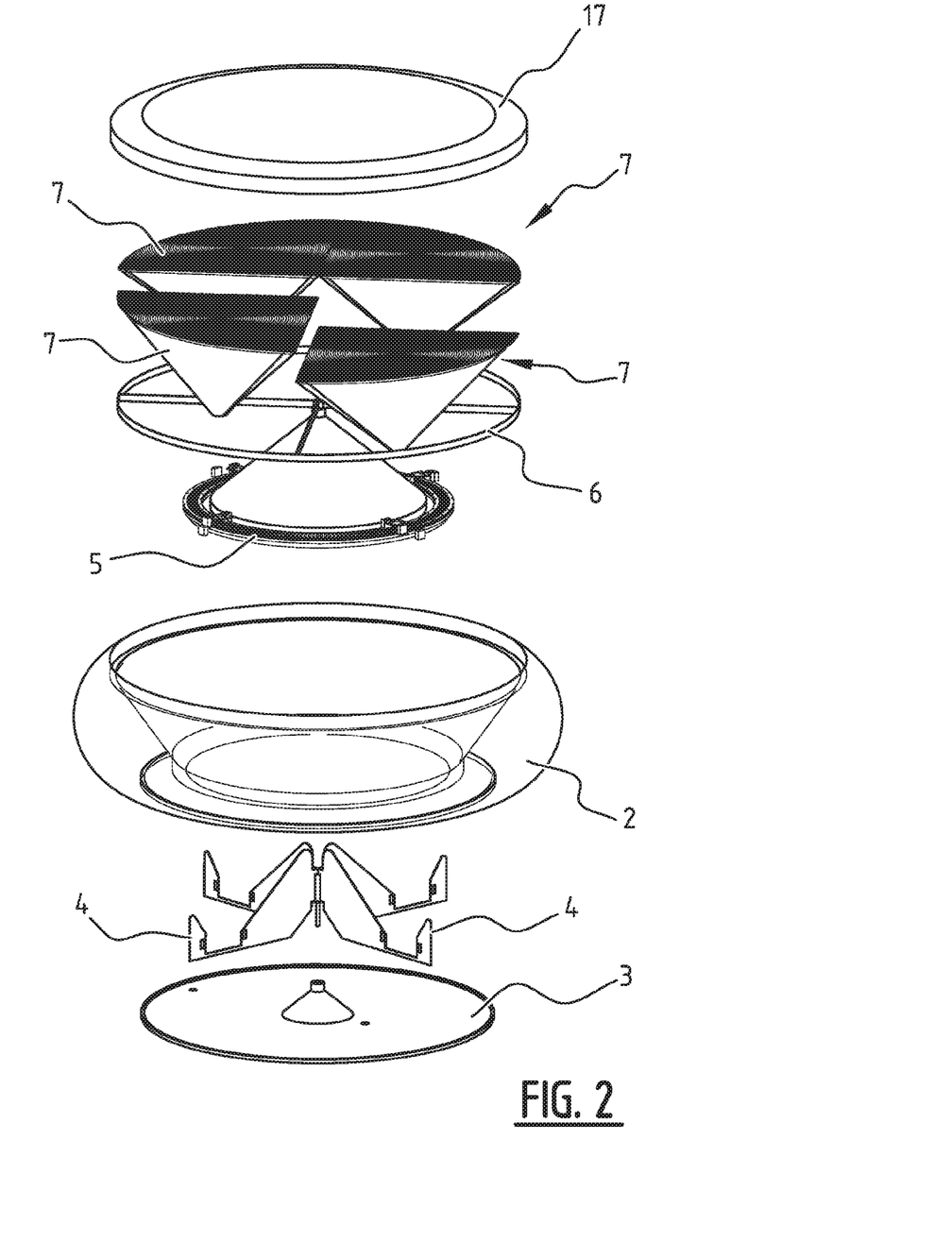
FIG. 2 shows an exploded perspective view of constituent parts of the embodiment in FIG. 1.
Figure 3:
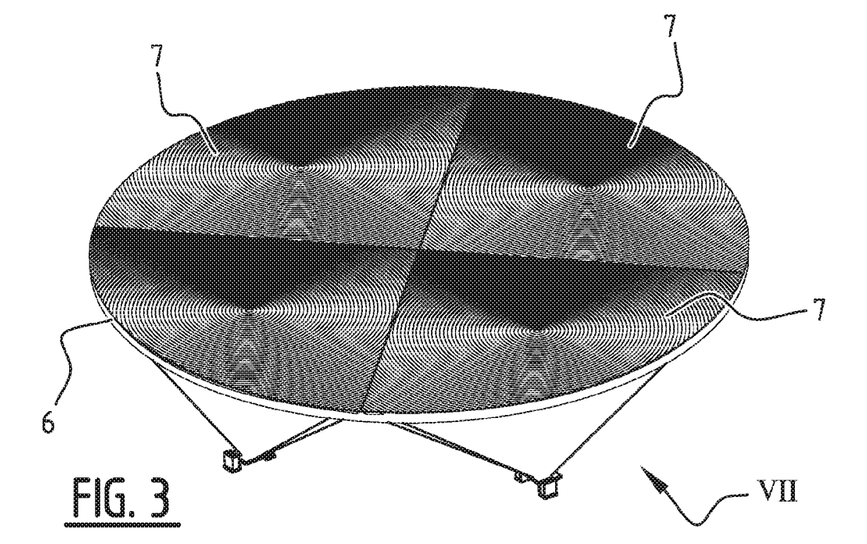
FIGS. 3-5 show individual perspective views of the constituent parts in FIG. 2.
Figure 4:
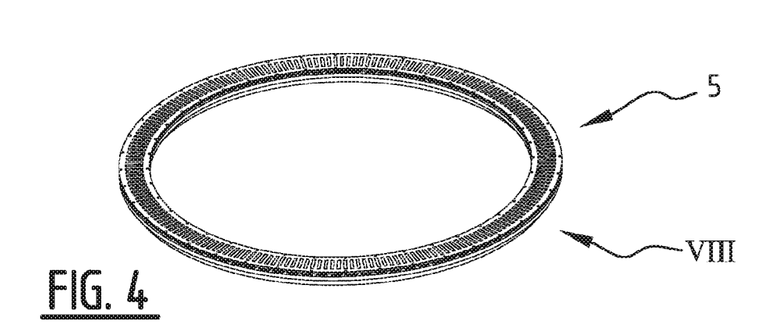
Figure 5:
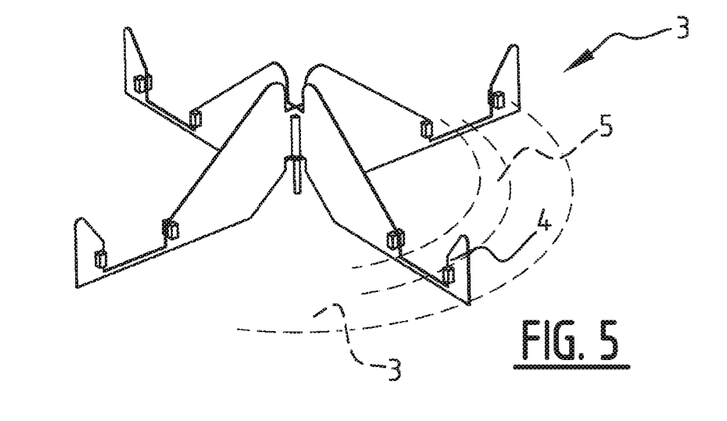
Figure 6:
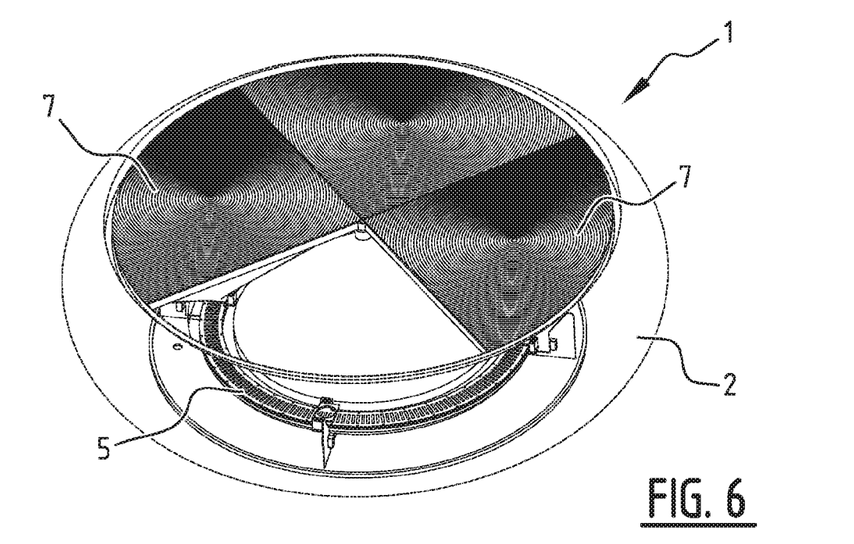
Figure 7:
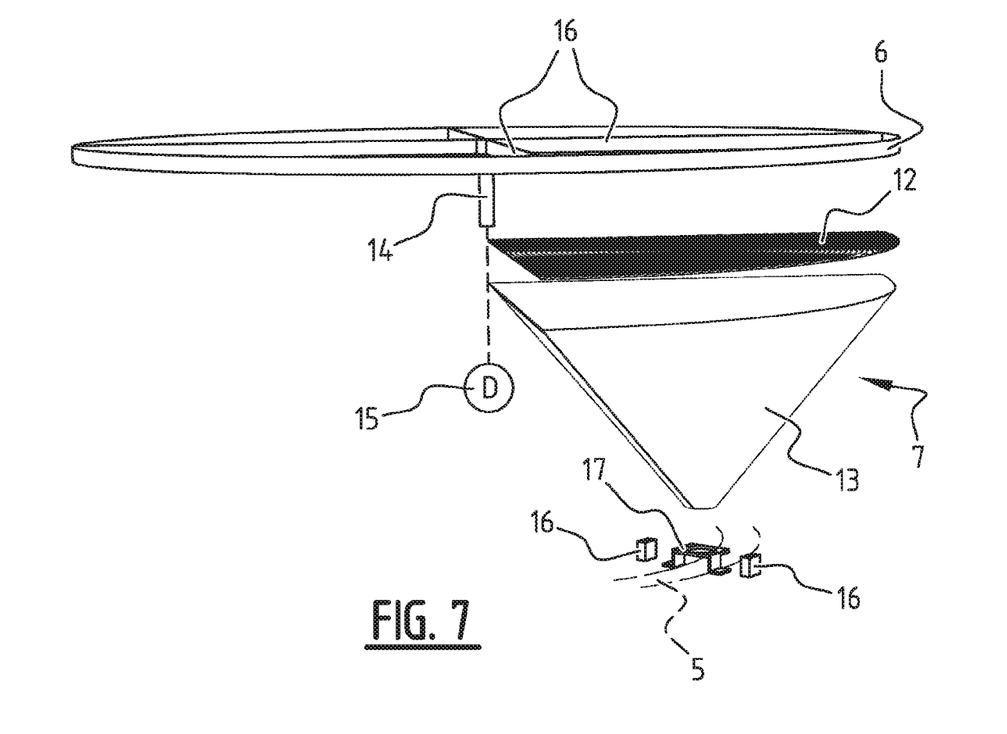
FIG. 7 shows a perspective view of selected moving components from several parts in FIGS. 3-5 along arrow VII in FIG. 3.
Figure 8:
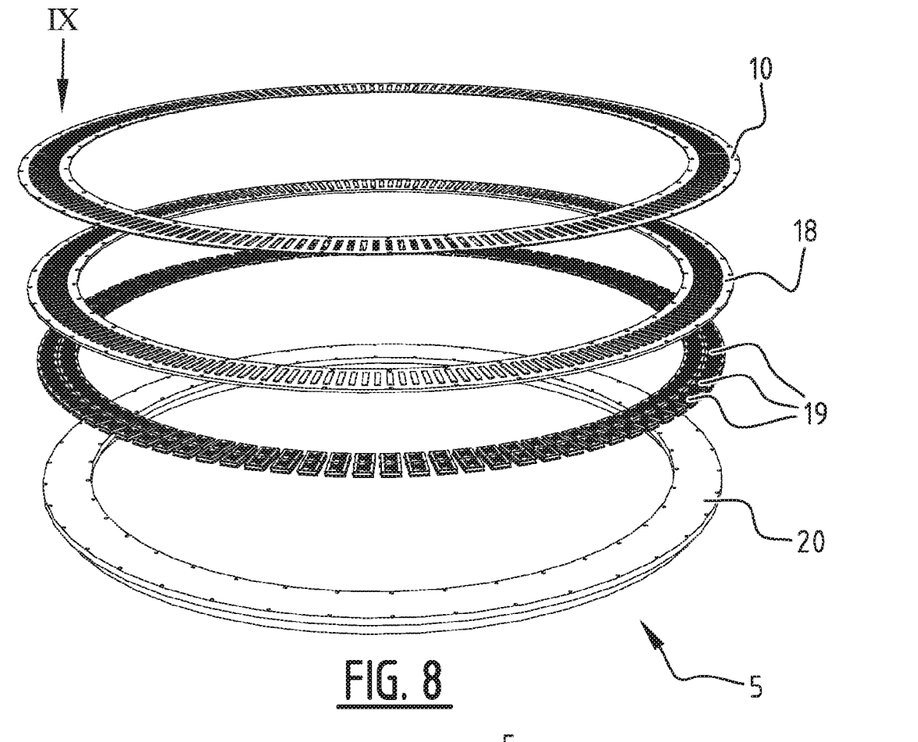
FIG. 8 shows an exploded perspective view of one of the constituent parts along arrow VIII in FIG. 4.
Figure 9:
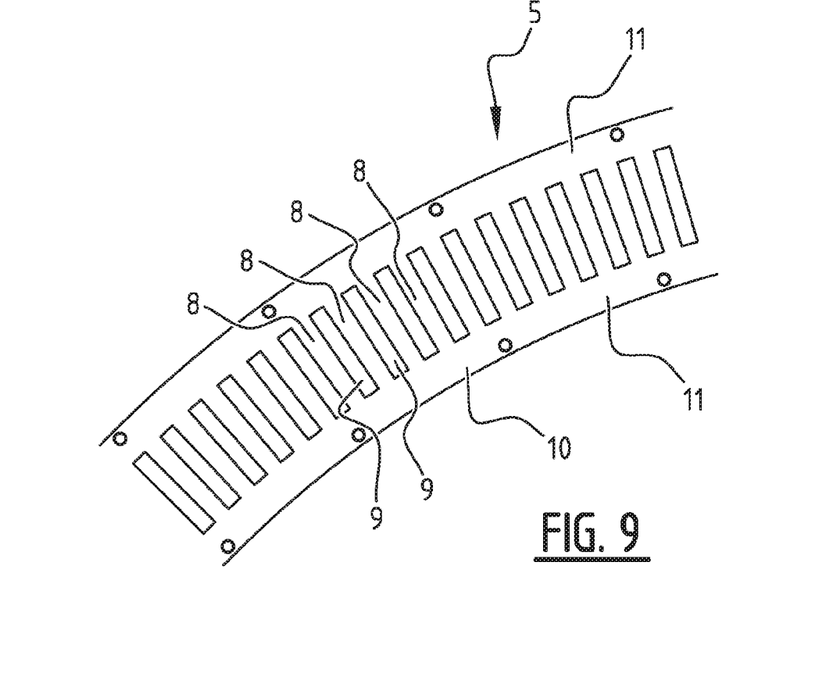
FIG. 9 shows a top view of the constituent component of FIG. 1 in an assembled state along arrow IX in FIG. 8.

FIGS. 1 and 6 show an impression of an embodiment of a generator 1 for converting heat into electrical energy according to the present disclosure. FIGS. 1 and 6 show the generator 1 in complementary perspective views whilst FIG. 2 shows an exploded view and FIGS. 3-5, 8 show some of constituent parts of the generator 1 in more detail, and FIG. 7 identifies moving components. Generator 1 and details thereof will be described below through reference to all the appended figures simultaneously.

Generator 1 may cover a square meter, or more or less, and comprises a housing 2 on a base 3. The housing 2 is preferably made of weather resistant material. Under the base 3, the generator may be arranged on a solar tracking system (not shown). In the art such tracking systems are available to the skilled person, and further detail of such a tracking system is omitted here.

Figure 10:
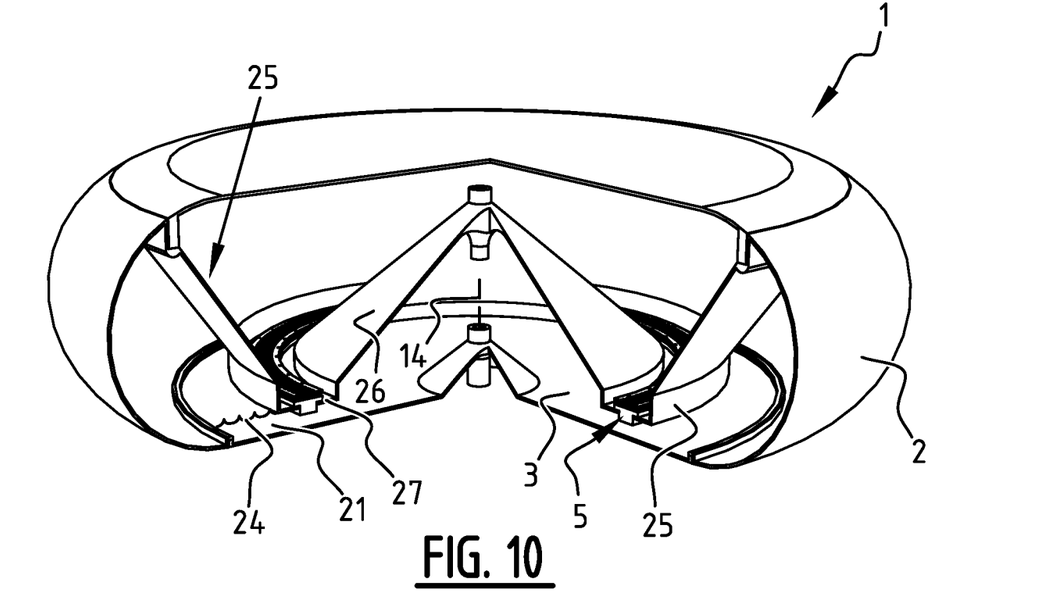
FIGS. 10 and 11 show details of the generator.
Figure 11:
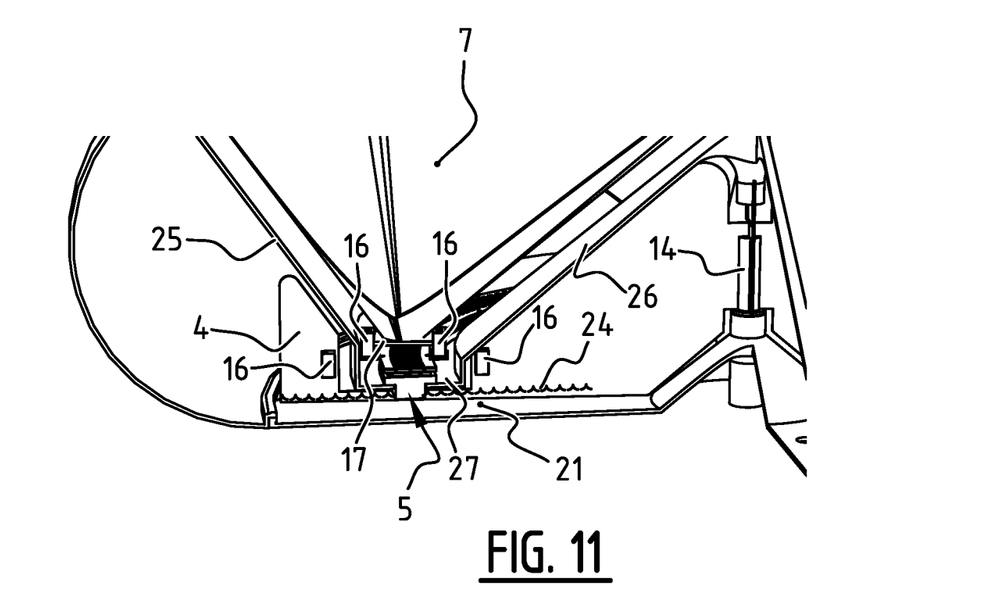

Base 3 forms a stationary support for the housing 2, closing off an optional opening at the underside thereof; the base may be an integral component of the housing 2, and comprises studs or an inner wall 25 of housing 2 in FIGS. 10, 11 to statically accommodate a ring 5 with ferromagnetic elements, here in de form of lamellae 8.

In the shown embodiment, the housing 2 is open at a top side and can be closed off by a removable lid 17

A ring 6 is rotatable relative to and in this embodiment even in the housing 2. Ring 6 is rotatably supported on rollers or bearings (not show) in or on housing 2, and is thus rotatable to form a moveable carrier for at least one, in the shown embodiment four, solar collectors 7. Relating to the above-mentioned dimension of housing 2 of a square meter, ring 6 may span 70 cm or more.

Each solar collector 7 defines a heat supply or together the solar collectors 7 define a single combined heat supply. The solar collectors 7 may focus on a common focus point on ring 5 of ferromagnetic lamellae 8, or may each focus on one of a plurality of focus points. Less or more than four solar collectors and associated focus points are possible within the scope of the present disclosure. Another heat supply than a solar collector is possible within the scope of the present disclosure, such as gas burner, which may also be arranged on the rotatable ring 6, but in case of a supply for fuel, such as gas, it may be preferable to revert the configuration such that the heat supply is stationary and the ring of ferromagnetic elements 8 is rotatable, which would merely require a kinematic reversal of the moving and stationary components, or wherein the ring 6 may carry the ferromagnetic elements 8 and the housing supports the solar collector(s) 7.

Ring 6 is exemplary and in an alternative embodiment, an endless belt or the like may be employed to form a reciprocally moveable carrier.

Each of the solar collectors 7 on rotating ring 6 may comprise one or more of a non-imaging linear 3D lens 12 or a domed non imaging linear 3D lens, a parabolic mirror, and a parabolic trough 13. Ring 6 comprises cross bars 16 for carrying the solar collectors 7 and a central axle 14, which axle 14 is connected to a dynamo 15 or other electrical energy generating device to generate electrical energy from the rotational movement of the ring 6.

The ferromagnetic elements are distinct, discrete lamellae 8 and are arranged at intervals 9 which may be formed by cut-outs from a ring 10. The ring may be 10 may be entirely made from ferromagnetic material or the inner and outer edges 11 may be made from another material. The lamellae 8 may be made of ferromagnetic material and/or an alloy, such as Heusler alloy. Other material may be equally applicable.

In this embodiment, the solar collectors 7 are configured to warm the at least one of the ferromagnetic elements/lamellae 8. When heated to a sufficient extent, higher than the Curie temperature of the material from which the lamellae 8, the warmed one of the lamellae 8 alters in magnetic attractability thereof. In this embodiment it loses magnetic properties and a neighbouring lamel 8 that is not yet warmed to this extent, will still have its normal attractability. In this embodiment, two magnets 16 are arranged alongside the ring 5, are fixed to rotatable ring 6 and attract the less warmed neighbouring lamel 8 to set or keep the rotatable ring 6 in motion. A single magnet 16 may suffice, or three or more magnets 16 may be provided. The magnets 16 may comprise permanent magnets or electromagnets, where electromagnets may be powered using electrical energy generated by the generator 1. Electromagnets may be adjustable in field strength and position. Permanent magnets can be only adjusted in position to influence the effectiveness/efficiency thereof in relation to the ring 5 and lamellae 8 thereof. Holder 17 may be adjustable to alter positioning of the magnets relative to ring 5.

In fact, the magnets 16 may attract or repel the sufficiently warmed one of the lamellae 8 or attracts another of the lamellae 8 neighboring the warmed one of the ferromagnetic elements. Sufficiently warmed lamellae 8 change in phase and magnetic properties thereof are then altered. Based thereon, ring 6 is set or kept in motion to drive dynamo 15 and/or pump 22, which is described in more detail herein below. The magnets 16 may be arranged on a funnel shaped armature 17 aside and/or atop of ring 5 and/or there below.

Stationary ring 5 comprises, in addition to the lamellae 8 in ring 10, a passive collector 18, thermo-electric generators 19 and heat sink 20. The heat sink 20 may define a T-shaped base of ring 5. In particular at least one of the thermo-electric generators 19 and heat sink 20 is provided to form part of a cooling system.

As noted above, ring 5 is a stationary support and ring 6 is rotatable, reciprocally moveable. A reason for this is formed by electrical connectors to the plurality of thermo-electric generators 19. However, drag contacts may be employed for output of electrical energy, whereby ring 5 may be the reciprocally movable carrier and allow ring 6 with the magnets 16 and solar connectors 7 to be the stationary support.

In the shown embodiment having both thermo-electric generators 19 and heat sink 20, thermo-electric generators 19 contribute to cooling of the lamellae 8 after having been warmed and use the discharged heat from the lamella for generating electrical energy, whereby efficiency and electrical output of generator 1 are increased and a need for additional cooling of lamellae is decreased. Heat sink 20 contributes to further and faster discharge of heat from the lamellae 8, for example into a body or water or coolant 21 inside housing 2. Water or coolant 21 fills a bottom part of housing 2 up to a water or coolant level 24, indicated in FIGS. 1, 10 and 11. Inner wall 25 is oblique, and tapers down to define a shoulder on which ring 5 is supported, and from which the T-shaped base of ring 5 extends down into the water or coolant 21. Opposite the oblique inner wall 25 of housing 2, relative to ring 5, a dome 26 is directly or indirectly connected to ring 6 where, at the base of dome 26, flange 27 extends under ring 5. Thus, a compartment for water or coolant 21 at the bottom of housing 2 is effectively separated from a space in housing above ring 5, and water turbulence or splashing (for example caused by rotating thrusters or vanes 4) can not reach solar collector(s) 7. As shown in FIG. 11, magnets 16 may be arranged on top and/or sides of funnel shaped armature 17, and/or in the compartment for water or coolant 21, more in particular on vanes 4.

Housing 2 may contain cooling for lamellae 8 in the form of water or coolant based cooling, air cooling for example using a fan, gel cooling for fast dissipation of heat, cooling fins may be employed, and/or a refrigeration system may be installed, in addition to or quite independent from (an invention in its own right) the thermo-electric generators 19. Any energy consuming cooling can be powered using energy from the generator 1 itself. Ring 5 may be just submerged in a layer of coolant or water 21. In the shown embodiment, just a T-shaped base of the ring 5 extends into top level the water or coolant 21. To reduce drag resistance, the moving components of ring 6, solar collectors 7 and magnets 16 are preferably above the water or coolant level.

In contrast, to promote the water or coolant 21 through a cooling system, the magnets 16 may be allowed to drag through the water 21. Additionally or alternatively, fins, blades or vanes 4 may be attached to ring 6 and/or to solar collectors 7 and/or to funnel shaped armatures 17, to stir the water or coolant 21 and promote circulation, even to the extent that pump 22 in the embodiment of FIG. 1 may be omitted, or the pump 22 and vanes 4 may be provided in an integrated or a complementary manner. Namely, to avoid excessive warming up of the water or coolant 21 in housing 2, which excessive heating could hamper cooling of the lamellae 8 to below the Curie temperature thereof, after having been heated to above this temperature, a pump 22 and/or vanes 4 may circulate the water or coolant 21 through a heat exchanger 23, back into housing 2. The rest heat extracted by heat exchanger 23 from the water or coolant 21 may aid a heating system, for example a building's central heating system. Water or coolant 21 may alternatively or additionally be allowed to store heat therein, to be extracted at a later time, when a heat demand from a heating system is detected. A reservoir may additionally be furnished for temporary storage of water or coolant 21, heated in the generator 1, for later extraction of heat, and/or generation of energy.

Further, as shown in FIG. 10, from which the solar collectors 7 have been omitted, an inner wall 25 of housing 2 carries ring 5, forming the stationary support. Heat supply is from the ring 6, using the solar collectors 7. However, the entire configuration may be reversed for the carrier to accommodate the solar or other heat collectors and the moveable support to carry the ferromagnetic elements.

In the shown embodiment, any number of thermo-electric generators 19 may be deployed, depending on an amount of heat from the solar collectors 7. The thermo-electric generators 19 may, as an example, be ninety six or one hundred and eight in number and each generate 2*(2V*0.5 A), resulting in a yield of 192 or 216 Watt. Thermo-electric generators 19 may comprise heat collectors or accumulators and heat-to-energy converters to output electric energy. Each of the thermo-electric generators 19 may comprise a pair of thermo-electric converters, each generating 2V at 0.5 A, thus arriving at the factor two in the above calculations.

Through the focused heating of the ferromagnetic lamellae 8, these lose, in this embodiment, their magnetic properties, as a consequence of which neighbouring cooler lamellae 8 are attracted or repelled by the magnets 16, and ring 6 is set or kept in rotary motion. This principle is based on a second degree phase change, related to the Curie temperature of the employed material of the lamellae 8. Rotation of the ring 6 and elements and components, connected there with, enables a thermal assurance that no elements or components of the generator 1 as a whole are overheated. Electrical energy is output on the basis of the dynamo 15 and the thermal-electric generators 19. Some of the gained electrical energy can be deployed for elements and/or components of the generator 1 itself, for example cooling and/or coolant circulation and/or pump 22 and/or any other component. Heat energy may be stored for later use, for example for heating purposes or later conversion of heat into electrical energy. Heat may be converted into electrical power through thermal couples, for example a Seebeck generator, as a potential embodiment of a thermo-electric generator 19. In particular such theremo-couples may be vulnerable when overheated, thus requiring cooling.

As an indication of the output of generator 1, a minimal immediate efficiency is expected of at least 15%, more in particular 19% or even 20% or more, where an extra 5% of efficiency can be achieved through heat accumulation in coolant or water 21 for later use, for example for generating electric energy and/or warm water.

Based on the aforementioned dimension of housing 2 of a square metre and of ring 6 of 70 cm, solar energy to the amount of four example 1000 Joules per second is converted into minimally 200 W, being output from the dynamo 15, thermo-electric generators 19 and heat storage in the system. The present disclosure thus relates to heat/energy conversion
  a. A heat source, for example solar heat, in combination with a rotating platform of ring 6
    a. an optical concentrator formed by solar collector(s) 7 as heat energy input from direct sunlight, comprising at least one of
      i. non imaging linear 3D lens 12
      ii. domed non imaging linear 3D lens
      iii. parabolic mirror
      iv. parabolic trough 13.
    b. other heat sources may be applicable (e.g. a static heat source in combination with a rotating collector)
    c. A central axle 14 construction and base platform formed by ring 6 to suspend one or more permanent/electro magnets and provide a stable and highly frictionless rotation
  b. A thermomagnetic switching device
    a. A heat receiver in the form of ring 5 that is capable to achieve a controlled localized thermomagnetic $2^{nd}$ stage phase transition within its, ferromagnetic metal and/or alloy (Heusler Alloy), body segmented in lamellae 8 when heat is applied
    b. A secondary non-ferromagnetic contact surface/heat receiver, equally lamellae-segmented but in opposite form and in close contact with the receiver as accumulator of the applied heat
    c. produces rotational force on the axle 14 during the interaction between the heat receiver and the rotating platform on ring 6.
  c. A thermoelectric generator that uses an array of thermocouples forming part of thermo-electric generators 19. Alternatively or additionally, a thermo-photo voltaic converter may be deployed
    a. To convert the latent heat, for example stored in coolant or water, released by the thermomagnetic device into electricity
    b. Based on a thermoelectric effect in, for example "a Heusler like ferromagnetic alloy or Skutterudite based compound and specifically chosen for this application. e.g. "Seebeck Generator"
    c. Has a hot and cold contact surface
    d. Is assembled between the heat energy accumulator surface and the cooler surface of the heat sink 20.
  d. A kinetic energy converter and temperature limiter
    a. At least one permanent/or electromagnetic fields of magnets 16 is brought in close vicinity of the heat energy aperture, derived from the heat source's focal point(s), are placed underneath and/or alongside and/or above the receiving surface of the heat receiver of which the lamellae 8 are a part. The magnets 16 are mounted at equal distances between them, capable of freely rotating along the center of the thermomagnetic and thermoelectric devices of thermo-electric generators 19.
    b. in relation to the magnetic fields, the chosen ferromagnetic material and the Curie temperature within the thermomagnetic converter, it serves as a temperature limiter for the thermoelectric device and itself
    c. To achieve extra cooling capabilities for the thermoelectric generator e.g. as a fluid pump 22 in order to refresh the heated with cooler fluid 21
    d. Or to account for an extra electromagnetic device based on rotation and Eddy currents, Faradays wheel, etcetera, when cooling is of no importance.

FIG. 1 shows an impression of a possible embodiment of a device according to the present disclosure. The shown conceptual prototype is based on an autonomous, fluid-cooled, thermo-electro-magnetic converter based on concentrated solar power (CSP).

This embodiment is merely a depiction of a variant explaining the various parts of this converter and therefore one of many possibilities for several models, sizes, constructions, conversion types and orientations, all possessing potentiality in different ways.

Direct sunlight is concentrated with at least one non-imaging-Fresnel lens 12 or a parabolic mirror construction and center-focused on a ferromagnetic, or Heusler-like alloyed, ladder-like thin ring 10 with cutouts, referred to below as an active collector, fitted over an equally laddered thicker, less deformable, ring 18 composed of a magnetic-neutral heat absorbing alloy with cutouts, referred to herein below as a passive collector 18, 19 to fit properly under the active collector ring 10. Heat absorbing ring 18 passes heat to the thermoelectric generators 19 there below.

The accumulation of direct concentrated sunlight and the latent heat active collector 10 serves as the input for the thermoelectric generators 19, which in turn convert the latent heat energy into electricity and releases any excess heat further into a heatsink 20 that is capable of releasing this heat energy into a gas, fluid such as water or coolant 21 or mass cooling capable contact surface.

While this thermodynamic flow of heat energy and its conversion into electrical power is taking place, a secondary thermomagnetic reaction is activated with the use of magnetic fields of magnets 16 directly attached and directed in relation to the focus points of lenses/parabolas 12, 13 on the rotating ring 6 which is also the mounting body for the lenses/parabolas 12, 13.

The interaction between the static mounting of the heat collector 10, 18 and the rotational capacity of the armature, in which the lenses 12 and magnet fields of magnets 16 are placed and held, takes care of the temperature control ability for heat collector 10, 18 and thermocouples in thermo-electric generators 19 to deliver surplus kinetic power on axle 14.

This power is then transformed into a centrifugal magnetic brake in order to control the temperature input received by the focal points of lens 12 or parabolic trough 13 by braking or releasing the number of rotations per minute of axle 14 and therefore increasing or decreasing the collector's core temperature. This braking results, in this case, in a secondary capacity to refresh the used heated cooling fluid with colder fluid from a cool fluid accumulation compartment or separate storage referred to above in conjunction with pump 22, and provide the user with surplus warm water if needed.

Magnetic Fields in Combination with Non-Imaging Fresnel Lenses (Magnetic Lens Rotor)

A 3D non-imaging linear Fresnel lens 12 is presently considered the most efficient way to concentrate direct sunlight into a focal point on ring 5 assuming paraxial reception of solar rays and therefore chosen as an exemplary model construction. However, as indicated above, alternatives are available within the scope of the present disclosure. When this lens is constructed as a dome-shaped 3D non-imaging linear Fresnel lens even higher efficiency is possible. Nevertheless, apart from the used concentrator, the rotating part 6, 7, 16 in this design consists of an armature 6 holding lens assemblies each consisting of a lens 12, a funnel 13, one or more electro/permanent magnets 16 and a central shaft 14 around which magnets 16 and lenses 12 and/or funnel 13 rotate. The lens 12 concentrates paraxial oriented light it receives from the sun into a focal point or line on ring 5. This concentrated light passes through the Fresnel lens 12 and Funnel 13, which serves as a safety guard against unwanted focal points that are the result of incident sunlight upon the ring 5, and the focal point or line is projected onto ring 5, covering equal parts, on the Active and Passive collectors. These collectors 10, 18, 19 are placed at a small distance from, and in direct vicinity of, the funnels apertures and also lenses at the bottom of trough 13 focal point or line, and centered with the Rotating Armatures Axle 14.

Active and Passive Collection of Heat Energy

The ring-shaped active collector 10 is responsible for the rotation of the Magnetic Lens Rotor due to its capability of undergoing controlled localized thermomagnetic $2^{nd}$ stage phase transitions when heat is applied.

These transitions, in this case, occur within the active material when it is spot-heated, e.g. with the use of the lenses 12, troughs 13 and potentially additional lenses at the bottom of the trough 13, resulting in focal points, in a predetermined designated area within an applied magnetic field of magnets 16 and are proportionally related to the applied temperature. When reaching its "Curie Temperature" some active materials lose their magnetic attraction ability and other materials reversibly gain the ability.

In this case: The used ferromagnetic material becomes less attractable by the magnetic field, yielding attraction forces to the neighboring cooler material thus: rotation.

The ring-shaped passive collector 18, 19 is responsible for the continuous accumulation and dissipation of heat acquired through its rim contact with the active collector 10 absorbing its latent heat energy, and from direct contact with the focal point. The interval of hits from the focal point, or in other words, gap size between the active collector lamellae 8, determines the direct light exposure ratio for the complete passive collector 18, 19 and should be predetermined in relation with the thermocouples used in the thermoelectric generators 19. Variations can be applied in thickness of the used active collector 10 in order to achieve more or less thrust on the rotating spindle 14.

It is imperative that the active collector is segmented as a solution for unwanted "Eddy currents" induced by the rotating state in relation to the magnetic field of magnets 16 and subsequently for adequate and balanced heat absorption by both collectors 10, 18, 19.

E.g.: If the material of the passive collector 18, 19 is neutral to the applied magnetic field, no further segmenting is needed, on the other hand, if the active collector 10 and the passive collector 18, 19 become integral parts of the thermocouple itself, e.g.: a two-type laminated magnetic core consisting of e.g.: nickel & alloys, segmenting becomes part of the resulting circuitry. In this case the thermopile type bismuth telluride ($Bi_2Te_3$) generators are used.

Both the active collector 10 and the passive collector 18, 19 are assembled and mounted, sandwiching the thermoelectric generator, against the heatsink 20.

Thermoelectric Conversion

The thermoelectric generators 19, in this case, constitutes the use of, for example: moderate temperature TEG's in combination with a heatsink 20 that is capable of providing sufficient cooling energy for its cold contact surface (e.g.:)+300 C°/+30 C° and the right material selected for the heat collectors. This heatsink 20 must be chosen in accordance with the right hot/cold ratio in mind and greatly determines the type and shape of thermoelectric generator 19 to use.

Forced Cooling Heatsink 20

Cooling can be achieved in many ways e.g.: air/gas, liquid (water or coolant), gel, or mass in the form of e.g. cooling fins. However in the shown embodiment, to which the present disclosure is not limited, has cooling by refreshing heated liquid coolant with cooler liquid in a closed circuit loop of pump 22 and heat exchanger 23, optionally also comprising a storage for heated fluids.

Extra liquid cooling can be achieved with placing radiators along the closed circuit path although we should keep in mind that any loss of heat is a loss of efficiency. Therefore, storage of heat energy could be a considered a preferred solution. The direct result of heating the collector is the rotation of the magnet/lens rotor body and with this rotation pump 22, such as a liquid centrifugal pump, refreshes the heated liquid with cooler liquid from a storage tank and/or heat exchanger 23. A contact surface of this heat exchanger 23 could be the surrounding air, a pond, swimming pool, lake, sea or other body of coolant.

Although the present disclosure through reference to the appended drawing may be understood by the skilled person, the scope of the present disclosure is not to be interpreted to be limited to any particular aspect of the disclosed embodiments, but is defined in the appended independent claim, where this scope may—in some jurisdictions—even encompass alternatives for particularly defined features of the appended claims.

The invention claimed is:

1. A generator configured to generate electrical energy from heat, comprising:
    a moveable carrier, which is reciprocally moveable along a movement path and connected to a kinetic-electric converter;
    a stationary support arranged at the movement path;
    wherein one of the carrier and the support is provided with a magnet arranged along or in the movement path and the other of the carrier and the support is provided with separate ferromagnetic elements arranged along or in the movement path;
    a heat supply associated with the one of the carrier and the support that is provided with the magnet, wherein the heat supply is configured to direct heat onto successively at least one of the ferromagnetic elements to warm at least one of the ferromagnetic elements to above a Curie temperature thereof to thereby impart reciprocal movement of the carrier relative to the support through magnetic interaction between the magnet and the ferromagnetic elements; and
    a cooling system configured for cooling the ferromagnetic elements, wherein the cooling system comprises a basin with water or coolant, over and into which the other of the carrier and the support extends for the water or coolant to be in thermal contact with the at least one of the ferromagnetic elements for cooling to below a Curie temperature after heating to above the Curie temperature thereof, wherein the basin is connected to a water or coolant circuit, and
    wherein the reciprocal movement of the moveable carrier circulates the water or coolant through the circuit.

2. The generator according to claim 1, wherein the cooling system comprises a thermo-electric generator arranged along or in at least a part of the movement path.

3. The generator according to claim 1, wherein the cooling system comprises a heat sink extending along or in at least a part of the movement path.

4. The generator according to claim 3, wherein the cooling system comprises a thermo-electric generator arranged along or in at least a part of the movement path, and wherein the heat sink is associated with the thermo-electric generator for cooling of the thermo-electric generator.

5. The generator according to claim 4, wherein the heat sink is arranged opposite the heat supply, relative to the thermo-electric generator.

6. The generator according to claim 5, wherein the thermo-electric generator is arranged on the heat sink, between the heat sink and the heat supply.

7. The generator according to claim 1, wherein the cooling system is configured to act on the at least one of the ferromagnetic elements warmed to above a Curie temperature thereof at a distance along the movement path relative to the heat supply.

8. The generator according to claim 1, wherein the cooling system is based on at least one coolant from a group comprising: air, water, gel, cooling fins, and refrigeration.

9. The generator according to claim 2, wherein the thermo-electric generator is arranged opposite the heat supply, relative to the ferromagnetic elements.

10. The generator according to claim 9, wherein the ferromagnetic elements are arranged on the thermo-electric generator, between the thermo-electric generator and the heat supply.

11. The generator according to claim 1, wherein the ferromagnetic elements are arranged on the support, and the heat supply and magnet are arranged on the carrier.

12. The generator according to claim 1, wherein the heat supply is configured to warm the at least one of the ferromagnetic elements to be warmed to alter magnetic attractability thereof, whereby the magnet attracts or repels the at least one of the ferromagnetic elements warmed above a Curie temperature thereof or attracts another of the ferromagnetic elements neighboring the at least one of the ferromagnetic elements warmed to above a Curie temperature thereof.

13. The generator according to claim 1, wherein the carrier comprises elements from a group comprising: thrusters, fins, blades, and stirring vanes, configured to circulate the water or coolant through the circuit, powered by movement of the carrier.

14. The generator according to claim 13, wherein the circuit comprises a heat storage connected to the circuit via a heat exchanger to extract heat from the water or coolant.

15. The generator according to claim 1, wherein the circuit comprises a heat storage connected to the circuit via a heat exchanger to extract heat from the water or coolant.

* * * * *